United States Patent
Ljunggren et al.

(10) Patent No.: US 10,511,254 B1
(45) Date of Patent: Dec. 17, 2019

(54) SOLAR PANEL ALIGNMENT DEVICE

(71) Applicant: BioLite LLC, Brooklyn, NY (US)

(72) Inventors: Anton Olof Ljunggren, New York, NY (US); Nisan H. Lerea, New York, NY (US); Hong-Ying Guo, Brooklyn, NY (US); Andrew Laska, Brooklyn, NY (US)

(73) Assignee: BioLite, Inc., Brooklyn, NY (US)

( * ) Notice: Subject to any disclaimer, the term of this patent is extended or adjusted under 35 U.S.C. 154(b) by 219 days.

(21) Appl. No.: 15/227,925

(22) Filed: Aug. 3, 2016

Related U.S. Application Data (60) Provisional application No. 62/200,602, filed on Aug. 3, 2015.

(51) Int. Cl.
*H02S 20/32* (2014.01)
*H01L 31/048* (2014.01)
*H01L 31/16* (2006.01)
*G01S 3/786* (2006.01)

(52) U.S. Cl.
CPC ............ *H02S 20/32* (2014.12); *G01S 3/7861* (2013.01); *H01L 31/048* (2013.01); *H01L 31/16* (2013.01)

(58) Field of Classification Search
USPC ...................................................... 250/203.4
See application file for complete search history.

(56) References Cited

U.S. PATENT DOCUMENTS

| | | | | |
|---|---|---|---|---|
| 3,996,460 A | * | 12/1976 | Smith | G01S 3/7861 250/203.4 |
| 4,346,521 A | * | 8/1982 | Luft | G04B 49/02 33/269 |
| 5,065,015 A | * | 11/1991 | Horiguchi | B60H 1/0075 250/203.4 |
| 5,117,744 A | * | 6/1992 | Zimmer | B60H 1/0075 236/91 C |
| 5,576,551 A | * | 11/1996 | Adair | G01J 1/38 250/472.1 |

(Continued)

FOREIGN PATENT DOCUMENTS

| | | | | |
|---|---|---|---|---|
| CN | 103513566 A | | 1/2014 | |
| CN | 203518265 U | | 4/2014 | |
| JP | 57120809 A | * | 7/1982 | ............ G01C 1/00 |

OTHER PUBLICATIONS

JP-57120809-A, Yanagi, Machine Translation (Year: 1982).*

(Continued)

*Primary Examiner* — Devina Pillay
(74) *Attorney, Agent, or Firm* — Loginov & Associates, PLLC; William A. Loginov (57) ABSTRACT

A solar panel alignment device can include a first alignment feature capable of casting a shadow onto a target area. The first alignment feature can be located above a central portion of the target area. The target area can have a second alignment feature that can indicate the location of the central portion of the target area. A method for aligning a solar panel is comprised of the steps of the operator orienting the panel towards the sun so that sunlight strikes the first alignment feature so that the first alignment feature that interrupts the path of the sunlight, creating a cast shadow upon the target area; and the operator moving the panel so that the cast shadow moves to a central portion of the target area.

12 Claims, 10 Drawing Sheets

(56) References Cited

U.S. PATENT DOCUMENTS

| | | | | |
|---|---|---|---|---|
| 6,297,740 | B1 * | 10/2001 | Hill | G01J 1/04 |
| | | | | 250/203.4 |
| 8,592,738 | B1 * | 11/2013 | Kozin | H02S 20/32 |
| | | | | 250/203.4 |
| 8,960,181 | B2 | 2/2015 | Lin | |
| 9,920,917 | B1 * | 3/2018 | Isik | G09F 13/18 |
| 2008/0000515 | A1 * | 1/2008 | Lin | H02S 40/38 |
| | | | | 136/246 |
| 2011/0048403 | A1 * | 3/2011 | Stavrou | F24S 50/20 |
| | | | | 126/573 |

OTHER PUBLICATIONS

Jodi & Julie, "New and Improved Sun Oven (ok this is really exciting!)", "http://web.archive.org/web/20150318095642/http://foodstoragemadeeasy.net/tag/global-sun-oven/[Aug. 26, 2016 3:56:44 PM]", Nov. 15, 2010, Publisher: Global Sun Oven Archives, Published in: US.

Opt Telescopes, "Tele Vue Sol Searcher Sun Finder", "https://web.archive.org/web/2015052042415/http://www.optcorp.com/tele-vue-sol-searcher-sun-finder.html]Aug. 26, 2016 4:01:10 PM]", , Publisher: OPT Telescopes, Published in: US.

\* cited by examiner

SOLAR PANEL ALIGNMENT DEVICE

RELATED APPLICATIONS

This application claims the benefit of U.S. Provisional Application Ser. No. 62/200,602, filed Aug. 3, 2015, entitled SOLAR PANEL ALIGNMENT DEVICE, the entire disclosure of which is herein incorporated by reference.

FIELD OF THE INVENTION

This invention relates to alignment devices for solar power cells and to the design and fabrication of the same.

BACKGROUND OF THE INVENTION

An assembly of multiple photovoltaic cells is often termed a solar array or solar panel. When a solar array is constructed so that all of the photovoltaic cells are oriented, it constitutes a solar photovoltaic panel. Such panels use emitted sunlight, or other significant ambient light sources, to generate and potentially store electricity for use with various electrically operated devices. However, such arrays function optimally only when properly aligned with the sunlight source. The earth is rotating, however, and the sun moves elliptically across the sky relative to a horizon, causing a loss of proper alignment, and thus, a reduction of power output.

SUMMARY OF THE INVENTION

This invention overcomes disadvantages of the prior art by providing a system and method for optimally aligning a solar cell and associated solar array/panel to the sun. In an embodiment, the illustrative solar panel alignment device can include a first alignment feature capable of casting a shadow, an opaque surface, and a target area on the opaque surface, with the target area having a central portion. The first alignment feature can be located above the central portion, so that when the sun is on a vector extending from the central portion through the first alignment feature, the first alignment feature casts a shadow on the central portion. The solar panel alignment device can include an alignment device assembly forming a well with an inner well wall and a bottom of the well, with the opaque surface at the bottom of the well. The device can include at least one stem mounted to the well, with the first alignment feature mounted on a second end of the stem. The solar panel alignment device can include a transparent outer well cover above the well. The first alignment feature can be on the outer well cover. The first alignment feature can be a spot on an inner surface of the outer well cover. The target area can include a second alignment feature indicating the location of the central portion. The second alignment feature can include lines oriented along vectors extending outwards from the central portion. The second alignment feature can include at least one circle arranged around the central portion. The device can include a seal between the transparent outer well cover and the well. The device can include a sealed chamber, where the sealed chamber includes the inner well wall, the bottom of the well, the transparent outer well cover, and the seal. The device can include at least one indicator light, and the opaque surface can include light sensors constructed and arranged to trigger the at least one indicator light when the shadow is not on the central portion, thereby indicating to a user that the solar panel should be aligned towards the sun. The device can include at least one motor connected to the solar panel, and the opaque surface can include light sensors constructed and arranged to trigger the at least one motor, thereby aligning the solar panel towards the sun.

In an embodiment, an illustrative solar panel alignment device can include an upper portion with an outer rim and a transparent cover. The transparent cover can include an alignment feature. The device can further include a lower portion having a target area with a second alignment feature and a bottom surface.

A method of aligning a solar panel with a light source can include directing a solar panel assembly towards a light source so that light strikes a first alignment feature, thereby casting a shadow onto a target area. The target area can have a central portion, with the first alignment feature above the central portion, so that when the light source is on a vector extending from the central portion through the first alignment feature, the first alignment feature casts a shadow on the central portion. The method can include moving the panel into alignment with the light source so that the shadow is on the central portion.

BRIEF DESCRIPTION OF THE DRAWINGS

The invention description below refers to the accompanying drawings, of which.

DETAILED DESCRIPTION

A solar power cell is a photovoltaic device that converts the energy of light directly into electricity by the photovoltaic effect, which is a physical and chemical phenomenon. The electrical characteristics of a cell, including current, voltage and resistance, will vary when exposed to sunlight. The cell can have 3 basic attributes: the absorption of light that generates either electron-hole pairs or excitrons, the separation of charge carriers of opposite types, and the separate extraction of those carriers to an external circuit. The power output of a panel will vary based on the different materials used, size and design.

Figure 1:
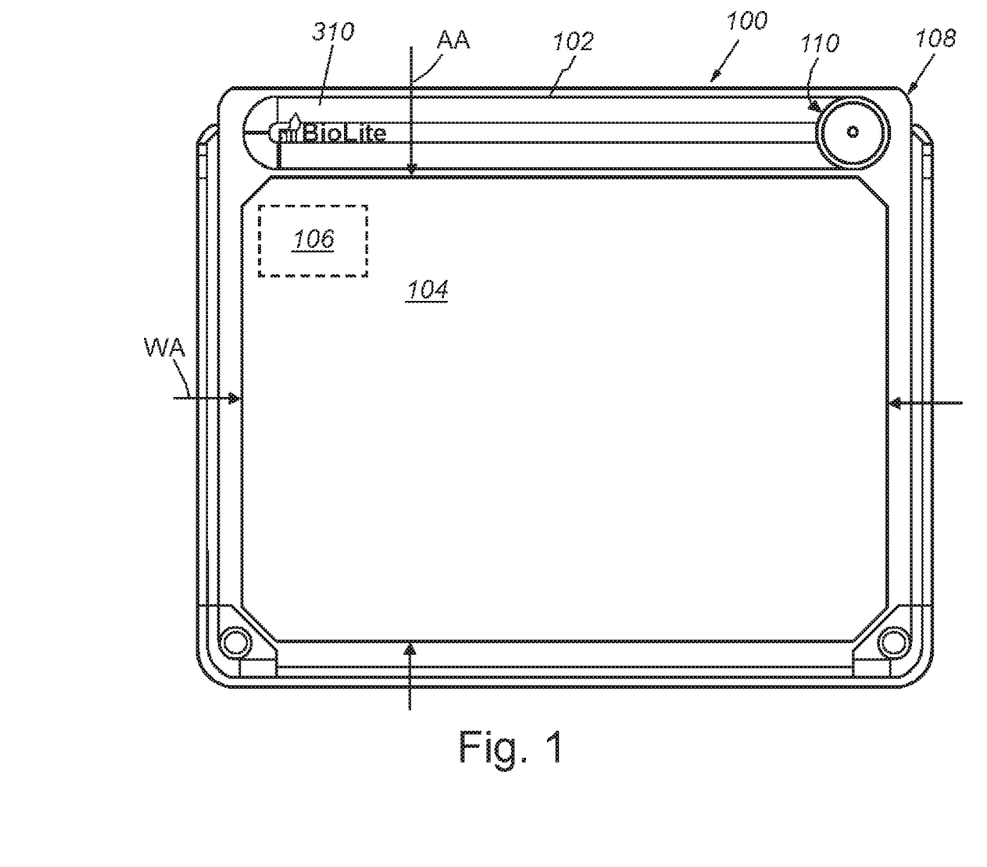
FIG. 1 is view of a solar panel with an alignment device assembly, according to an illustrative embodiment.

FIG. 1 is a view of an exemplary solar panel assembly 100. The panel assembly 100 is provided with a frame 102 and an array 104 of at least one photovoltaic cell 106. The frame 102 can be any shape and can have a substantially rectilinear shape, as shown in FIG. 1. In the substantially rectilinear example, the frame 102 can have rounded edges to provide a sleeker look and feel. The panel assembly 100 and frame 102 is depicted as having a height HA of approximately 8 inches (e.g., 8±1 inch) and a width WA of approximately 10 inches (e.g., 10±1 inch) with a power output of approximately 5 watts (e.g., 5±1 watt). In other examples, the panel 100 can be dimensionally larger or smaller. A panel alignment device assembly 110 can be disposed in the vicinity of a corner 108 of the frame 102, or alternate locations such as along an edge of the frame, between solar cells, or other locations. The alignment device assembly 110 allows a user to align the panel 100 with the sun to optimize panel performance, as will be more fully described below. The frame 102 can be constructed according to any number of methods and in this example is constructed by injection molding and can be formed of an elastomeric and/or non-elastomeric polymer, for example, ABS (acrylonitrile butadiene styrene).

Figure 2:
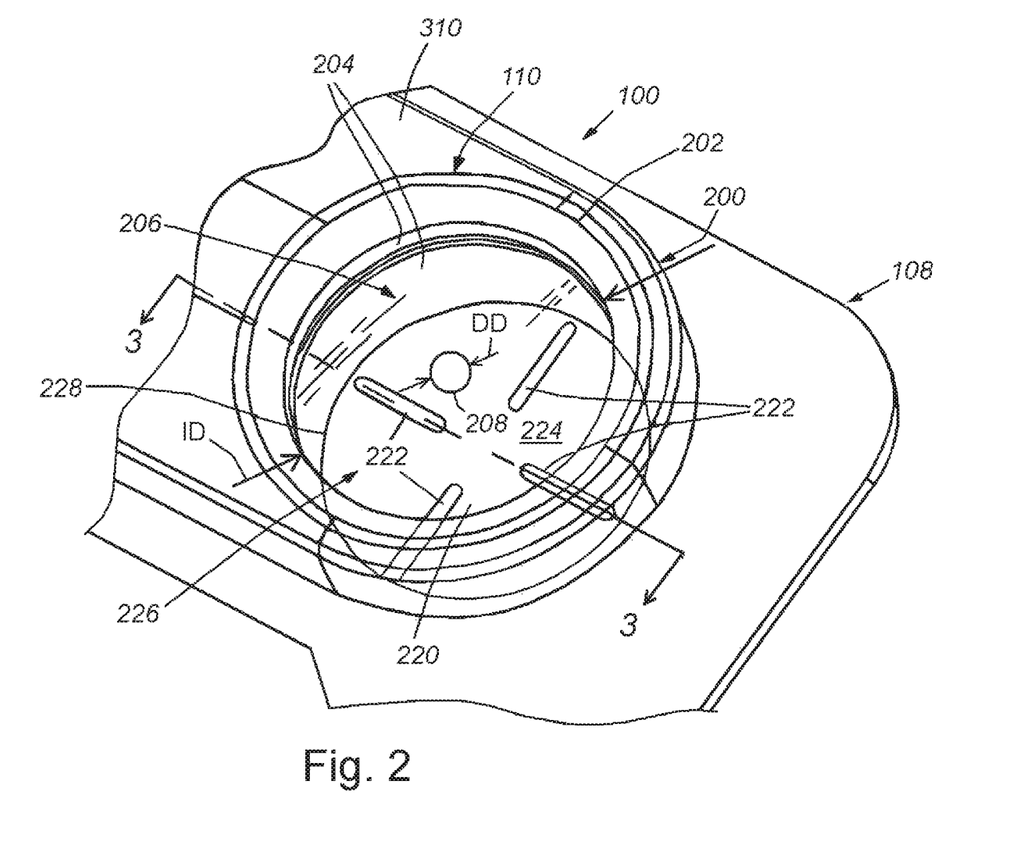
FIG. 2 is a view of the alignment device assembly, according to an illustrative embodiment.

FIG. 2 is a view showing a portion of the panel assembly 100 of FIG. 1, with an enlarged view of the alignment device assembly 110. The alignment device assembly 110 can describe a circular well 200 in the face of the panel 100. The alignment device assembly can include a circular well 200, an outer rim 202, an inner well wall 204, a transparent outer well cover 206 with one or more first alignment features 208, and a target area 226 that can have one or more second alignment features 222 disposed around a central portion 224. In this example, the first alignment feature 208 can be a disk, but in other examples the alignment feature 208 can have other shapes and sizes. The second alignment feature 222 can have one or more lines generally in the shape of a cross, with certain portions near the intersection of the cross being omitted. The alignment device assembly 110 can be a molded cylindrical housing composed of constituent parts and residing in a cutout hole in the frame 102. In other embodiments, the geometry of the alignment device assembly can describe a square-shaped well, or another regular or irregular shape. The alignment device assembly 110 can reside within the circular well 200. The well 200 can include an outer rim 202 and an inner well wall 204. The inner diameter ID of the well 200 can be approximately 0.75 inches (38 mm) (e.g., 0.75+/−0.10 inches). A transparent outer well cover 206 can be placed at or near the outside edge of the inner well wall 204 and can be a top layer. The transparent cover 206 can be composed of ABS (acrylonitrile butadiene styrene), PC (Polycarbonate), or another material. The inner surface, that is to say, the surface that faces the inside and/or bottom of the well, can be provided with the first alignment feature 208 (e.g., a disk) disposed thereon. The first alignment feature 208 can be a dot having a diameter DD of approximately 0.10 inches (6 mm) (e.g., 0.10±0.1 inches). The first alignment feature 208 can be constructed as a raised surface on the inner surface to which paint has been applied, inked onto the inner surface, a disk of material applied to the surface with an adhesive, or an opaque disk on a transparent applied material (a decal) onto the inner surface, or by another mechanism. It is also specifically contemplated that the first alignment feature 208 can be provided on the outside of the transparent cover 206, embedded within the transparent cover 206, or can be suspended within the well 200 and anchored to the inner well wall 204, transparent cover 206, and/or bottom of the well, or other means to suspend an opaque object or other object capable of casting a shadow above the target area 226.

The target area 226 can be on a lower opaque surface 220 that is at the bottom of the well 200. The lower opaque surface can be the bottom molding surface 228 of the well 200. The lower opaque surface 220 can be provided with one or more second alignment features 222. In one example, the second alignment feature 222 comprises four indices, disposed at cardinal points (e.g., "north", "south", "east" and "west") around a central portion 224. In other examples, it is contemplated that there can be three or fewer, or more than four indices, all arranged around the central portion 224. In an illustrative embodiment, the second alignment feature 222 can be formed by printing on an adhesive that can be adhered onto the bottom molding surface 228 of the well 200, an applied paint, an inked feature on a transparent appliqué layer (a decal), or by paint applied to raised features formed onto the bottom molding surface 228, or by another mechanism. The target area can include the second alignment feature 222 together with the central portion on the bottom molding surface 228. In other embodiments, it is contemplated that the second alignment feature 222 can be arranged to form a square, a circle, a triangle, a star or another polygonal shape on the target area. The lower opaque surface 220 can be white or another light or off-white hue, for example, a very light silver hue or a very light fluorescent orange hue. The second alignment feature 222 can be a darker hue to contrast with the lighter background hue of the lower opaque surface 220, so that the second alignment feature stands out against the background. For example, black indices against a white background. As used herein, the directional terms, such as, but not limited to, "up" and "down", "upward" and "downward", "rear", "rearward" and "forward", "top" and "bottom", "inside" and "outer", "front" and "back", "inner" and "outer", "interior" and "exterior", "downward" and "upward", "horizontal" and "vertical" should be taken as relative conventions only, rather than absolute indications of orientation or direction with respect to an acting direction of the force of gravity. Likewise, terms such as "substantially" and "approximately" generally imply that a given measurement resides within a tolerance generally acceptable for proper function. In many instances such tolerance can be between 1 and 5%.

Figure 3:
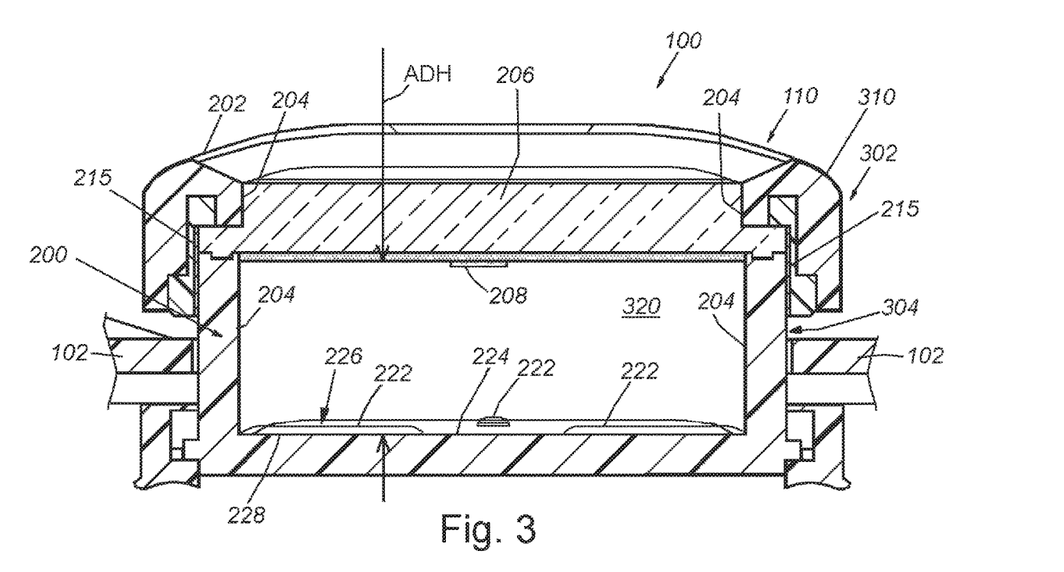
FIG. 3 is a cross-sectional view of the alignment device assembly along lines 3-3 of FIG. 2, according to an illustrative embodiment.

FIG. 3 shows a cross-section of the alignment device assembly. The alignment device assembly 110 can be constructed of a first (upper) portion 302 and a second (lower) portion joined at a seam that can be a seal 215. The first portion 302 can include the outer rim 202, inner well wall 204, and transparent outer well cover 206 with a first alignment feature 208 (e.g., a disk). The second portion 304 can include a bottom molding surface 228 that can have one or more second alignment features 222 disposed around a central portion 224. The upper portion 302 can be unitarily formed (formed as a part of) with the outer housing 310. In other embodiments, the upper portion 302 can define a cylindrical ring and can be unitary with an element of the solar panel assembly. In still other examples, the alignment device assembly can be inserted into the solar panel assembly as an independent assembly and held in place by a snap fit, glue, weld or other connection mechanism. In the illustrative embodiment, the upper and lower portions 302, 304 can be coformed with the various parts of the solar panel assembly and assembled as part of the assembly process of the solar panel. In an embodiment, the alignment device assembly can have a inner height ADH of approximately 0.375 to 0.5 inches (8-12.5 mm) (e.g., 0.375 to 0.5±0.1 inch) that is the distance between the inside surface of the cover 206 and the bottom molding surface 228. The first and second portions 302,304 can be formed of an injection molded non-elastic polymer. Regarding the seal 215, the seal can be an injected rubber material, or similar material, or an O-ring. The seal 215 can create and maintains a water-tight and air-tight seal that prevents air and moisture from entering into the interior volume 320 that is defined as the space between the cover 206, the bottom molding 228 and the inner walls 204. The interior volume of the space can be approximately 0.25 cubic inches. The interior volume 320 can be filled with an inert gas, for example, nitrogen or argon. The airtight quality of the inner volume 320 can prevent water build up or fogging of the interior surface of the cover 206.

Figure 4:
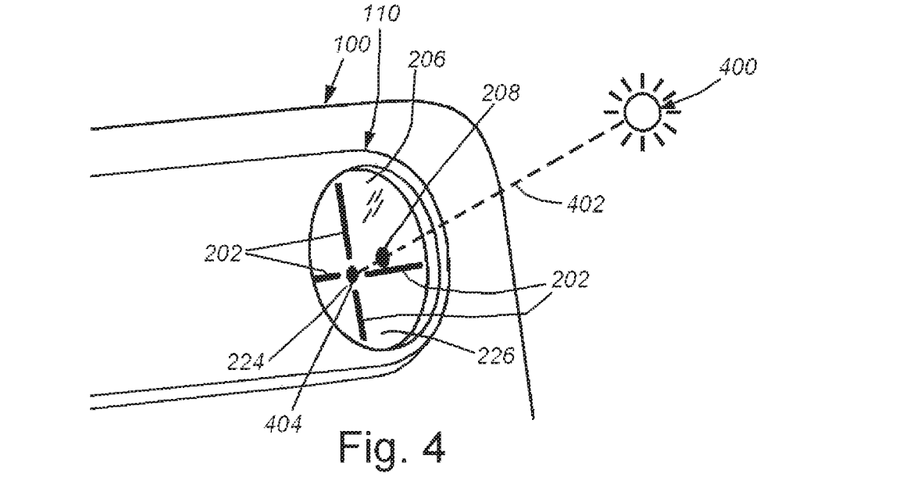
FIG. 4 is a schematic view of the path of sunlight through the alignment device assembly, according to an illustrative embodiment.
Figure 5:
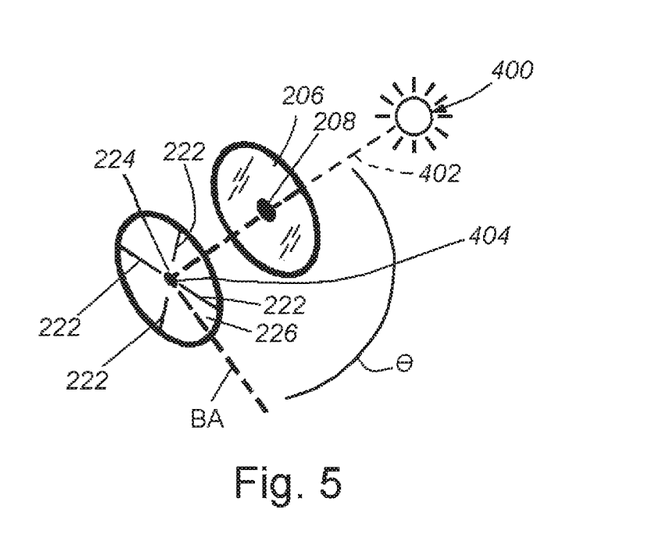
FIG. 5 is schematic view of the path of sunlight through the alignment device assembly, according to an illustrative embodiment.

As shown in FIG. 4, the alignment device assembly 110 can be a passive optical device incorporated into a solar panel assembly for the purpose of aligning the assembly toward the sun or other light source. As the sun 400 moves across the sky throughout the day following its elliptic path, sunlight passes along a path 402 that is interrupted by the first alignment feature 208 that creates a cast shadow 404 that gradually moves over the target area 226. This change in state visually alerts the user to reposition the solar panel assembly 100 as necessary in order to maintain an optimized position relative to the sun for maximum total electrical output. In this regard, the solar cells associated with the solar panel assembly experience optimal output when they are positioned perpendicular or orthogonal to the sun. When the surfaces 206, 226, and alignment features 208 and 222 are in planes that are parallel to the solar cells, the shadow can indicate an efficiency of the overall solar panel assembly. In FIG. 4, the cast shadow 404 is shown as being within the central portion 224, with the second alignment feature 222 (e.g., indices) arrayed about it. This positioning can be considered optimal for the panel assembly, as both the features 208, 222, as well as the solar cells, are perpendicular or orthogonal to the sun. This optimal positioning is further depicted in FIG. 5, wherein an angle θ is defined as the angular orientation between a vector from the sun 400, through the first alignment feature 208, to the central portion 224, and an axis BA drawn along the top surface of the bottom molding 228 and that angle θ is ninety degrees (90°). In use, the alignment device assembly 110 allows the operator of the solar panel 100 to position the panel perpendicularly toward the sun, thus maximizing the solar energy collected from the sun and consequently maximizing the electrical energy generated by the solar panel. This alignment can be accomplished without the expenditure of additional electrical energy and without the need for additional sensing circuitry, by providing a means for the operator to align a shadow cast by the sun with a target area inside the device. When the shadow is thus aligned with the central portion of the target, the solar panel is aligned perpendicularly to the sun with a high degree of accuracy. As noted above, the alignment device can comprise a transparent upper layer 206 fixed some distance above an opaque lower layer (about ½" in the first embodiment). An opaque first alignment feature 208 (e.g., dot or disk) or other graphic feature can be printed onto the transparent upper layer such that, when light shines through that layer and onto the lower layer, a shadow in the shape of the dot is projected onto the lower layer. A cross, circle, or other graphic feature (e.g., second alignment feature 222) can be printed onto the lower layer which aligns with the dot shadow when (and only when) the solar panel is oriented perpendicularly to the sun or other light source. A method for aligning a solar panel can include the steps of the operator directing the panel towards the sun so that sunlight strikes the first alignment feature and the first alignment feature interrupts the path of the sunlight, creating a cast shadow upon a target area; and the operator moving the panel so that the cast shadow moves to a central portion of the target area.

Figure 6:
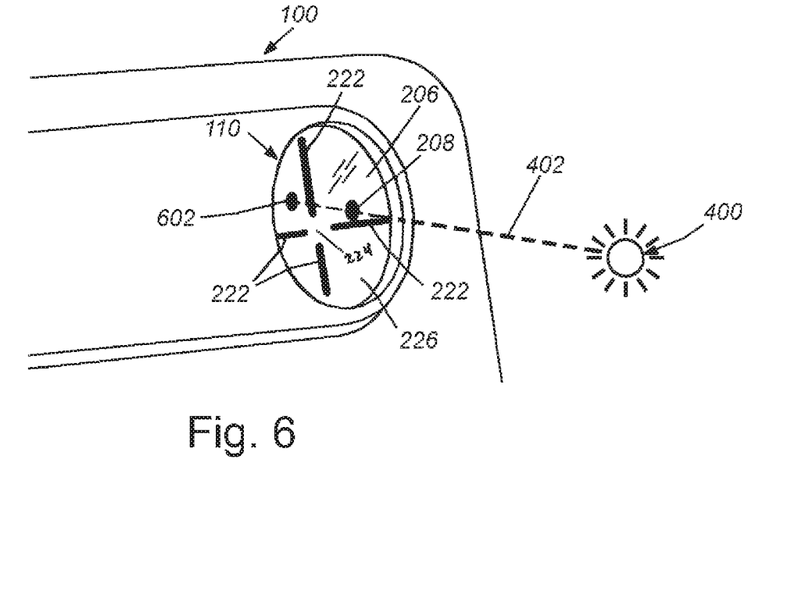
FIG. 6 is a schematic view of the path of sunlight through the alignment device assembly, according to an illustrative embodiment.
Figure 7:
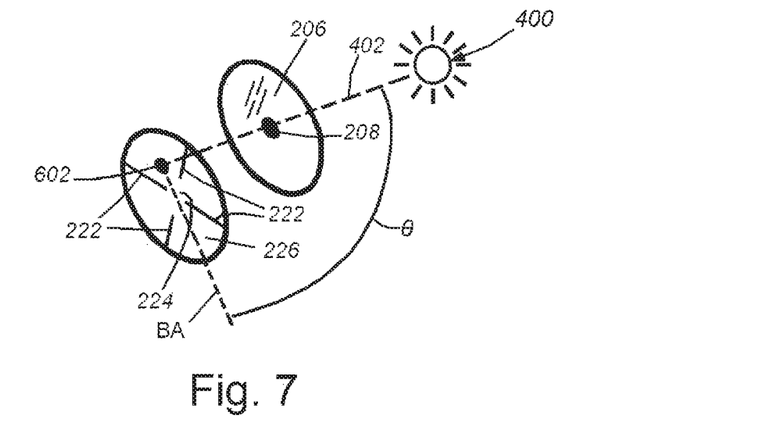
FIG. 7 is a schematic view of the path of sunlight through the alignment device assembly, according to an illustrative embodiment.

FIGS. 6 and 7 show a mis-alignment of the panel that serves as a visual cue to alert the user to re-position the panel for optimal power output. In FIGS. 6 and 7, the mis-aligned shadow 602 falls outside of the central portion 224. Shadow 602 is outside the central portion 224 because angle θ is less than ninety degrees. The indices 222, whether depicted in the illustrative embodiment, or disposed as a circle or square, can visually assist the operator in re-positioning the panel so that the cast shadow 602 moves into the central portion 224 and the power output is optimized.

Figure 8:
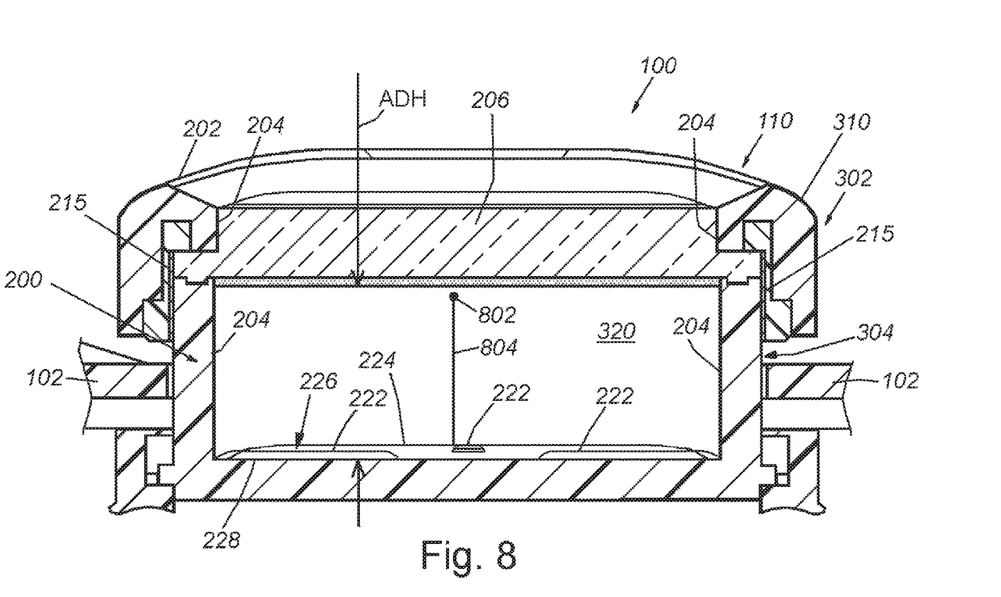
FIG. 8 is a cross-sectional view of the alignment device assembly along lines 3-3 of FIG. 2 with a first alignment feature according to an alternate embodiment.
Figure 9:
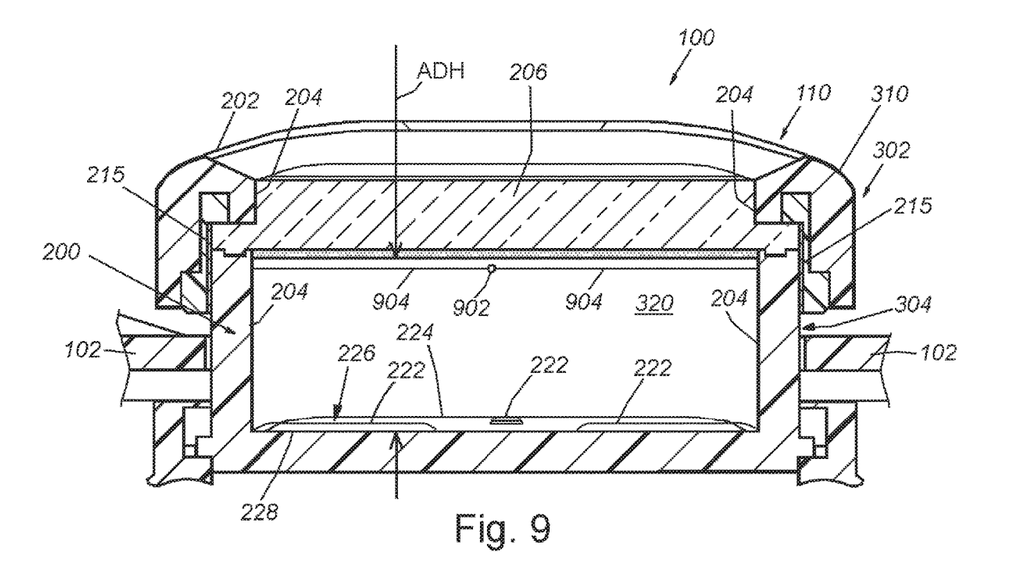
FIG. 9 is a cross-sectional view of the alignment device assembly along lines 3-3 of FIG. 2 with a first alignment feature according to another alternate embodiment.

FIG. 8 is a cross-sectional view of the alignment device assembly along lines 3-3 of FIG. 2, with a first alignment feature 802 according to an alternate embodiment. The first alignment feature 802 can be a bead, disc, or other object suspended above the central portion 224. The first alignment feature 802 can be mounted on a stem 804. The stem can be a rigid post. The stem 804 can be mounted to the bottom of the well, so that the first alignment feature 802 is suspended above the central portion 224. FIG. 9 is a cross-sectional view of the alignment device assembly along lines 3-3 of FIG. 2, with a first alignment feature 902 according to another alternate embodiment. The first alignment feature 902 can be a bead, disc, or other object suspended above the central portion 224. The first alignment feature 904 can be mounted on at least one stem 904. The at least one stem 904 can be a rigid post. The at least one stem can be two or more stems 904 extending inward from the well wall 204. The two or more stems 904 can be wire or string supporting the first alignment feature 902.

Figure 10:
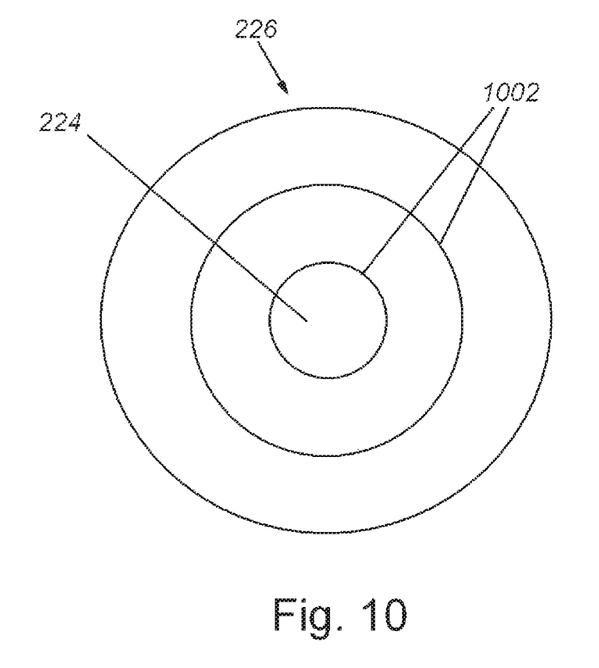
FIG. 10 is a view of the target area with second alignment features, according to an alternate embodiment.

FIG. 10 is a view of the second alignment features, according to an alternate embodiment. The second alignment features 1002 can be concentric circles arranged around the central portion 224.

Figure 11:
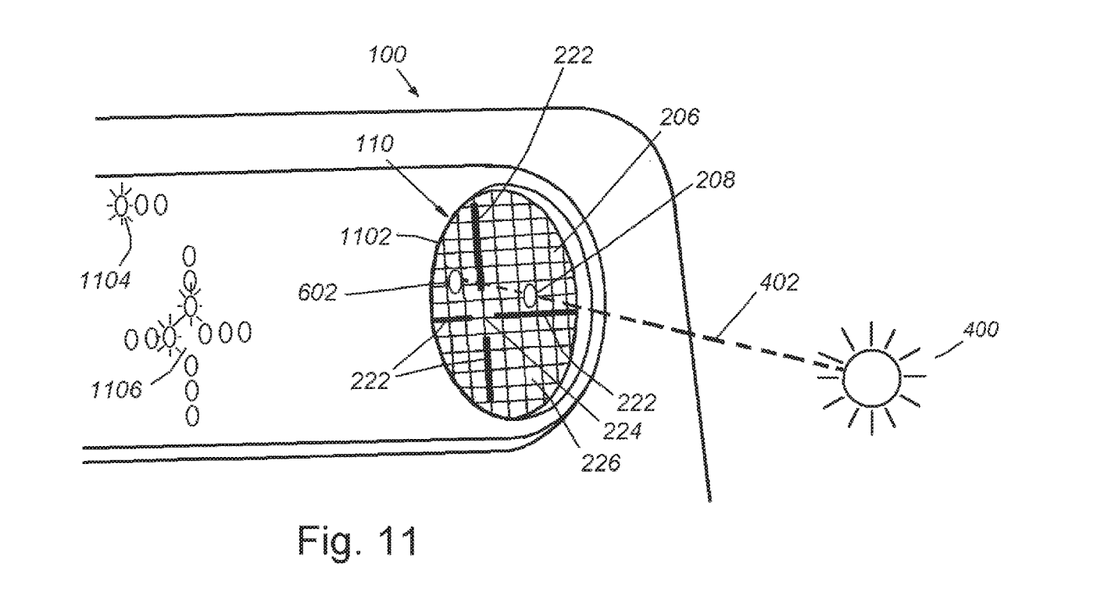
FIG. 11 is a schematic view of an alignment device with light sensors and indicator lights according to an embodiment.

FIG. 11 is a schematic view of an alignment device with a plurality of light sensors according to an alternate embodiment. The bottom of the well 200 can include a plurality of light sensors 1102. The light sensors 1102 can be used to detect the shadow cast by the first alignment feature, by detecting the absence of sunlight (not detecting light) on some sensors 1102. By way of non-limiting example, in FIG. 11 the shadow 602 is shown above and to the left of the central portion 224. Sensors 1102 at the location of shadow 602 will not detect sunlight at the same intensity as other sensors. When sensors 1102 at the location of the shadow 602 detect sunlight at a lower intensity than other sensors 1102 or do not detect sunlight, at least one indicator light 1104 can indicate to a user that the solar panel needs to be realigned. In an embodiment, the at least one indicator light can be a single light alerting the user that the solar panel needs to be realigned. The at least one indicator light 1104 can change in color or intensity to indicate that the shadow 602 is increasingly distant from the central portion 224. An increasing number of indicator lights 1104 can be used to indicate that the shadow 602 is increasingly distant from the central portion 224, so that a single light can be used when the shadow 602 is close to the central portion 224, and more lights can be illuminated as the shadow moves outward from the central portion due to the path of the sun through the sky. Indicator lights can also be arranged in a crosshair pattern 1106 similar to the second alignment feature 222. By way of non-limiting example, when the shadow 602 is above and to the left of the central portion 224 as shown in FIG. 11, lights on the lower-vertical and right-horizontal members of the crosshair pattern 1106 of indicator lights can be illuminated indicating that the solar panel should be adjusted down and to the right.

Figure 12:
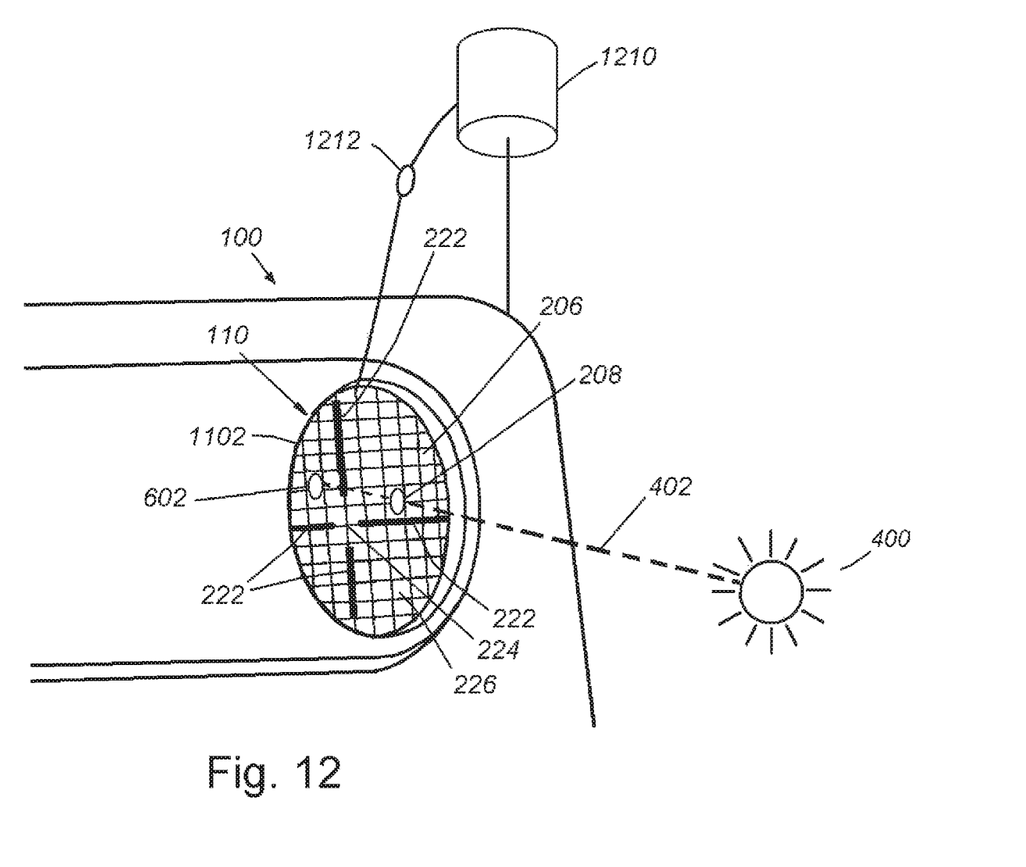
FIG. 12 is a schematic view of an alignment device with light sensors and motors according to an embodiment.

FIG. 12 is a schematic view of an alignment device with light sensors and motors according to an embodiment. Motors 1210 can be operatively connected to the solar panel so that the panel can be aligned towards the sun automatically. By way of non-limiting example, four motors 1210 could be utilized to elevate the four corners of the solar panel, with one motor 1210 associated with each corner. As the shadow moves to the upper left of the central portion 224, as shown in FIG. 11, a motor 1210 associated with the upper left corner of the solar panel can elevate the upper left corner of the solar panel, thereby aligning the solar panel with the sun and moving the shadow 602 back to the central position 224. Alternately, a motor 1210 associated with the lower left corner of the solar panel can lower the lower left corner of the solar panel, thereby aligning the solar panel with the sun and moving the shadow 602 back to the central position 224. Each of the four motors 1210 could be associated with a quadrant of the array of light sensors, with the upper right quadrant being associated with the upper right motor, the upper left quadrant being associated with the upper left motor, etc. Alternate numbers of motors, such as three, could also be used, with the array of light sensors being divided into three corresponding zones. Switches 1212 can be used to trigger the motors. When a light sensor in an upper right quadrant detects sunlight of a decreased intensity or an absence of sunlight, a switch can be triggered to power a motor to elevate the upper right corner of the solar panel. Alternately, a processor can be used to monitor the light sensors and trigger an appropriate motor. It should be clear that the alignment device assembly can be a passive optical device incorporated into a solar charging product for the purpose of aligning the product toward the sun or other light source that does not require moving parts, electronics or other mechanisms. The device can provide a visual cue for properly aligning the solar panel and thereby optimizing power output. Such a device can be built into a solar panel or constructed as a stand-alone device. Although the sun is depicted as the source of energy, any device or source of electromagnetic energy can be used as a source of visible or non-visible light, such as a xenon or mercury illumination source, or an infrared light source.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, while the alignment device assembly can be physically incorporated into the housing of the solar panel, it can be built as a stand-alone device that is otherwise attached to the solar panel. The graphics on the target area can describe a square, a circle or series of concentric circles, a triangle, or another design. The placement of the target area upon the bottom molding can be by adhesives, painting, or another method. Accordingly, this description is meant to be taken only by way of example, and not to otherwise limit the scope of this invention.

What is claimed is:

1. A solar alignment device comprising:
   a first alignment feature, the first alignment feature being an object capable of casting a shadow;
   an opaque surface;
   a transparent cover above the opaque surface, the first alignment feature on the center of the transparent cover;
   a target area on the opaque surface, the target area having a central portion, wherein the first alignment feature is located above the central portion, whereby when a sun is on a vector extending from the central portion through the first alignment feature, the first alignment feature casts a shadow on the central portion;
   an upper portion, the upper portion comprising:
      an upper cylindrical inner well wall;
      a circular transparent outer well cover that is the transparent cover, the circular transparent outer well cover located above the upper cylindrical inner well wall, the circular transparent outer well cover having the first alignment feature at a center of the circular transparent outer well cover; and
      an outer rim above the circular transparent outer well cover, and a lower portion, the lower portion comprising:
      a bottom molding surface, wherein the opaque surface and target area are on the bottom molding surface; and
      a lower cylindrical inner well wall, the lower cylindrical inner well wall and the upper cylindrical inner well wall having the same inner diameter and the lower cylindrical inner well wall and upper cylindrical inner well wall forming a circular well, the upper cylindrical inner well wall and the lower cylindrical inner well wall equidistant from a central axis of the solar alignment device and aligned with the upper cylindrical inner well wall above the lower inner cylindrical well wall; and
   a seal between the upper portion and the lower portion, wherein the upper portion, the lower portion, and the seal together form a sealed chamber.

2. The solar alignment device of claim 1, further comprising an additional seal between the transparent outer well cover and the circular well.

3. The solar alignment device of claim 1 further comprising at least one indicator light, and wherein the opaque surface further comprises light sensors constructed and arranged to trigger the at least one indicator light when the shadow is not on the central portion, thereby indicating to a user that the solar alignment device should be aligned towards the sun.

4. The solar alignment device of claim 1, further comprising a solar panel assembly, the solar panel assembly comprising an array of at least one photovoltaic cell and a rectilinear frame around the array of at least one photovoltaic cells, the rectilinear frame having a cutout hole, and wherein the circular well is in the cutout hole.

5. The solar alignment device of claim 1, wherein the inner diameter of the circular well and the diameter of the opaque surface on the bottom of the circular well are approximately 0.75 inches, and wherein a diameter of the first alignment feature is approximately 0.1 inches.

6. The solar alignment device of claim 1, wherein the sealed chamber defines an interior volume of approximately 0.25 cubic inches.

7. The solar alignment device of claim 1, wherein the upper portion further comprises an encircling lip that extends outward and downward from the rim, and encircles at least a portion of the lower cylindrical inner well wall, and wherein the seal is located between the encircling lip and an outer sidewall of the lower inner cylindrical well wall.

8. The solar alignment device of claim 7, wherein the upper cylindrical inner well wall and the lower cylindrical inner well wall have inner diameters of approximately 0.75 inches, and wherein the circular outer well cover has a diameter that is larger than 0.75 inches, and wherein an outer rim of the circular outer well cover is sandwiched between the upper cylindrical inner well wall and the lower cylindrical inner well wall, the outer rim of the circular outer well cover having a circular ridge extending downward from a lower surface, and the lower cylindrical inner well wall having a circular groove on a top surface of the lower cylindrical inner well wall, the circular ridge engaged within the circular groove, the encircling lip encircling the outer rim of the circular outer well cover and the lower cylindrical inner well wall, and wherein the seal is in sealing contact with the upper cylindrical well wall, the outer rim of the circular outer well cover, the lower cylindrical inner well wall, and the encircling lip.

9. The solar alignment device of claim 1, wherein the first alignment feature has a diameter that is approximately $2/15$ of the diameter of the circular well.

10. The solar alignment device of claim 9, wherein the first alignment feature is a spot on an inner surface of the outer well cover.

11. The solar alignment device of claim 1, wherein the target area further comprises a second alignment feature on the target area indicating the location of the central portion.

12. The solar alignment device of claim 11, wherein the second alignment feature comprises at least one circle arranged around the central portion, wherein a center of the at least one circle is at the central portion.

* * * * *